(12) United States Patent
Watanabe

(10) Patent No.: US 10,873,355 B2
(45) Date of Patent: Dec. 22, 2020

(54) HIGH FREQUENCY CIRCUIT, FRONT-END CIRCUIT, AND COMMUNICATION DEVICE

(71) Applicant: Murata Manufacturing Co., Ltd., Kyoto (JP)

(72) Inventor: Daisuke Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/818,410

(22) Filed: Mar. 13, 2020

(65) Prior Publication Data
US 2020/0220568 A1 Jul. 9, 2020

Related U.S. Application Data

(63) Continuation of application No. PCT/JP2018/031864, filed on Aug. 29, 2018.

(30) Foreign Application Priority Data

Sep. 15, 2017 (JP) ................. 2017-177529

(51) Int. Cl.
*H04B 1/18* (2006.01)
*H03F 1/56* (2006.01)
*H03F 3/19* (2006.01)

(52) U.S. Cl.
CPC ............. *H04B 1/18* (2013.01); *H03F 1/565* (2013.01); *H03F 3/19* (2013.01); *H03F 2200/222* (2013.01); *H03F 2200/451* (2013.01)

(58) Field of Classification Search
CPC .. H04B 1/18; H04B 1/16; H03F 1/565; H03F 3/19; H03F 2200/222; H03F 2200/451; H03H 7/38; H03H 2007/386
See application file for complete search history.

(56) References Cited

U.S. PATENT DOCUMENTS 8,913,976 B2 12/2014 Khatri et al.
10,326,484 B1 * 6/2019 Ayranci ............... H04L 1/00
(Continued)

FOREIGN PATENT DOCUMENTS

JP 2001102877 A 4/2001
JP 2011204629 A 10/2011
(Continued)

OTHER PUBLICATIONS

International Search Report issued in Application No. PCT/JP2018/031864, dated Nov. 20, 2018.
(Continued)

*Primary Examiner* — Nguyen T Vo
(74) *Attorney, Agent, or Firm* — Pearne & Gordon LLP

(57) ABSTRACT

A high frequency circuit (4) includes a first terminal (40a), a second terminal (51a), a third terminal (51b), a first path, a second path, a first matching element (41) and a first amplifier (50a) both arranged in the first path, a first switch (42) connected between a reference terminal and a part of the first path, the part spanning between the first matching element and the first amplifier, a second matching element (43) and a second amplifier (50b) both arranged in the second path, and a second switch (44) connected between the reference terminal and a part of the second path, the part spanning between the second matching element and the second amplifier.

20 Claims, 9 Drawing Sheets

(56) References Cited

U.S. PATENT DOCUMENTS

| | | | |
|---|---|---|---|
| 2012/0120322 A1* | 5/2012 | Satou | H01Q 9/145 |
| | | | 348/726 |
| 2014/0203887 A1 | 7/2014 | Murata et al. | |
| 2016/0049986 A1* | 2/2016 | Cho | H04B 1/48 |
| | | | 370/278 |
| 2016/0127115 A1 | 5/2016 | Hayafuji | |
| 2018/0227006 A1 | 8/2018 | Yasuda | |

FOREIGN PATENT DOCUMENTS

| | | |
|---|---|---|
| JP | 2014140115 A | 7/2014 |
| JP | 2016500968 A | 1/2016 |
| WO | 2015008557 A1 | 1/2015 |
| WO | 2017073509 A1 | 5/2017 |

OTHER PUBLICATIONS

Written Opinion issued in Application No. PCT/JP2018/031864, dated Nov. 20, 2018.

* cited by examiner

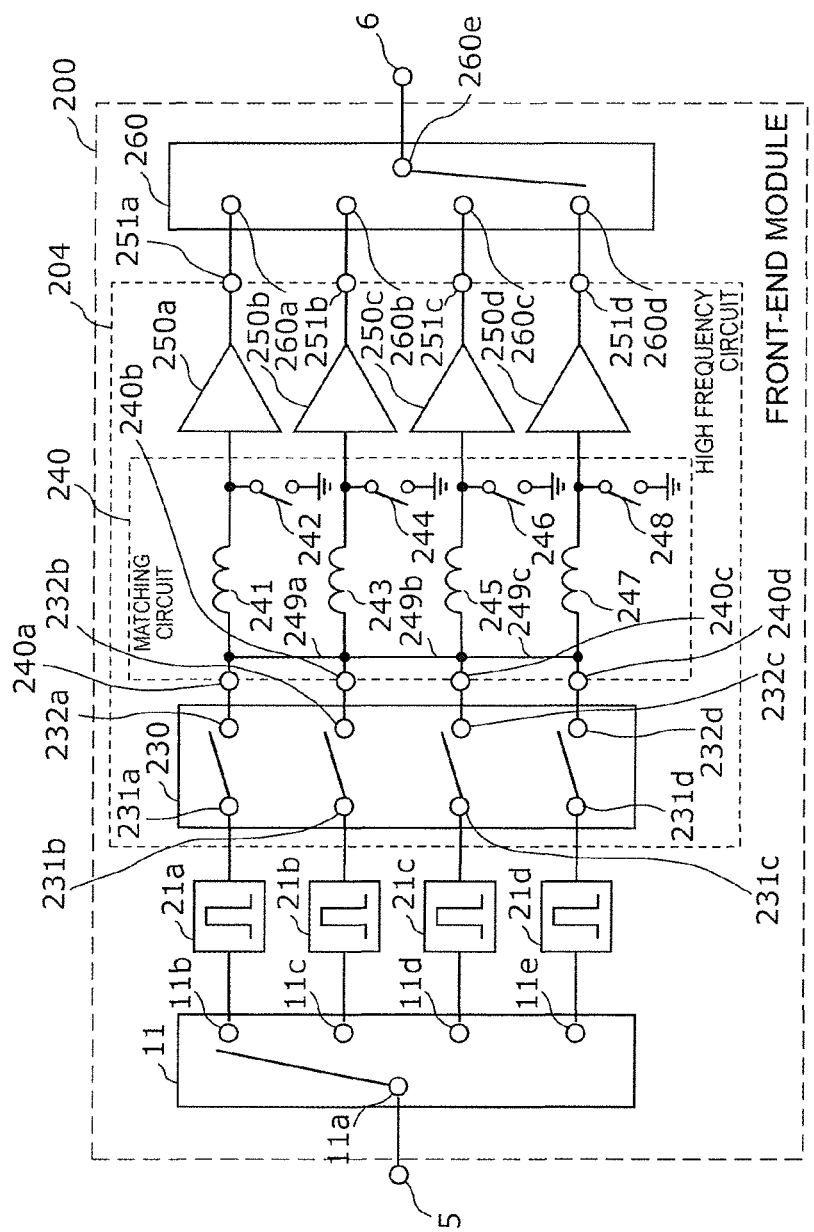

HIGH FREQUENCY CIRCUIT, FRONT-END CIRCUIT, AND COMMUNICATION DEVICE

This is a continuation of International Application No. PCT/JP2018/031864 filed on Aug. 29, 2018 which claims priority from Japanese Patent Application No. 2017-177529 filed on Sep. 15, 2017. The contents of these applications are incorporated herein by reference in their entireties.

BACKGROUND OF THE DISCLOSURE

Field of the Disclosure

The present disclosure relates to a high frequency circuit, a front-end circuit, and a communication device.

Description of the Related Art

Recently, a circuit adaptable for a plurality of high frequency reception signals has been demanded in the field of a high frequency module such as a high frequency front-end circuit, (see, e.g., Patent Document 1).

Patent Document 1 discloses a configuration of a high frequency module in which a plurality of high frequency reception signals in multiple bands are received and then amplified by one low-noise amplifier. Patent Document 1 further discloses a configuration of a high frequency module in which the signal received per band is amplified by a low-noise amplifier connected to each reception path.

Patent Document 1: Japanese Unexamined Patent Application Publication No. 2011-204629

BRIEF SUMMARY OF THE DISCLOSURE

However, the configuration of the high frequency module amplifying the individual signals by one low-noise amplifier requires a high-performance low-noise amplifier to be adapted for the plurality of frequencies. Moreover, the configuration including the low-noise amplifier arranged per band causes a problem that, because a matching element is disposed in a path per band, the number of matching elements included in the entire high frequency module increases and it is difficult to reduce the size of the high frequency module.

The present disclosure has been made with intent to solve the above-mentioned problems, and an object of the present disclosure is to provide a high frequency circuit, a front-end circuit, and a communication device in each of which high frequency signals at a plurality of frequencies are amplified with high accuracy and the size reduction is realized.

To achieve the above-mentioned object, an embodiment of the present disclosure provides a high frequency circuit including a first terminal, a second terminal, and a third terminal; a first path connected between the first terminal and the second terminal and transferring a signal in a first frequency band; a second path connected between the first terminal and the third terminal and transferring a signal in a second frequency band that is different from the first frequency band; a first matching element and a first amplifier both arranged in the first path; a first switch connected between a reference terminal and a part of the first path, the part spanning between the first matching element and the first amplifier; a second matching element and a second amplifier both arranged in the second path; and a second switch connected between the reference terminal and a part of the second path, the part spanning between the second matching element and the second amplifier, wherein the first switch is turned to an off-state and the second switch is turned to an on-state when the signal is transferred to the first path, and the first switch is turned to an on-state and the second switch is turned to an off-state when the signal is transferred to the second path.

With the above-described high frequency circuit, by selectively turning on/off the first switch and the second switch, impedance matching can be performed with the common use of the first matching element and the second matching element when any one of the first amplifier and the second amplifier is used. Accordingly, the number of matching elements used in the high frequency circuit can be reduced in comparison with that required when a matching circuit is arranged per band (frequency band). As a result, high frequency signals at a plurality of frequencies can be amplified with high accuracy, and the high frequency circuit having a smaller size can be provided.

The high frequency circuit may further include a third switch having at least one common terminal, and the at least one common terminal may be connected to the first terminal.

With the above features, the high frequency circuit can select one of the signal in the first frequency band and the signal in the second frequency band by a switch circuit, can select the amplifier corresponding to each of those frequency bands, and can perform the impedance matching suitable for each amplifier.

The at least one common terminal may be one common terminal, and the at least one common terminal may be the first terminal.

With the above features, even when the number of common terminals is one, the impedance matching can be performed with the common use of the first matching element and the second matching element. Accordingly, the number of matching elements used in the high frequency circuit can be reduced in comparison with that required when the matching element is arranged per band. As a result, high frequency signals at a plurality of frequencies can be amplified with high accuracy, and the high frequency circuit having an even smaller size can be provided.

The at least one common terminal may be provided as a plurality of common terminals, and the plurality of common terminals may be electrically connected to each other.

With the above features, the impedance matching on the input side of each of the first amplifier and the second amplifier can be performed by optionally combining the matching elements connected to the common terminals. Accordingly, the accuracy in the impedance matching can be increased. Furthermore, the impedance matching on the input side of each of the first amplifier and the second amplifier can be performed by freely changing the number of common terminals and thereby optionally combining the matching elements connected to those common terminals. As a result, the accuracy in the impedance matching can be increased.

The high frequency circuit may further include a third matching element that is connected between a common junction point between the first matching element and the second matching element and the at least one common terminal.

With the above feature, the impedance matching on the input side of each of the first amplifier and the second amplifier can be performed with the first matching element, the second matching element, and the third matching element. Accordingly, the accuracy in the impedance matching can be further increased.

The high frequency circuit may further include a fourth terminal; a third path connected between the first terminal and the fourth terminal and transferring a signal in a third frequency band that is different from the first frequency band and the second frequency band; a fourth matching element and a third amplifier both arranged in the third path; and a fourth switch connected between the reference terminal and a part of the third path, the part spanning between the fourth matching element and the third amplifier, wherein, when the signal is transferred to any one of the first path, the second path, and the third path, one of the first switch, the second switch, and the fourth switch, the one switch being arranged between the reference terminal and the any one path through which the signal is transferred, is turned to an off-state and at least one of the first switch, the second switch, and the fourth switch, the one switch being arranged between the reference terminal and one of the paths other than the any one path through which the signal is transferred, is turned to an on-state.

With the above features, by selectively turning on/off the first switch, the second switch, and the fourth switch, the impedance matching can be performed with the common use of at least two among the first matching element, the second matching element, and the fourth matching element when any one of the first amplifier, the second amplifier, and the third amplifier is used. Accordingly, the number of matching elements used in the high frequency circuit can be reduced in comparison with that required when the matching circuit is arranged per band (frequency band). As a result, high frequency signals at a plurality of frequencies can be amplified with high accuracy, and the high frequency circuit having a smaller size can be provided.

Furthermore, to achieve the above-mentioned object, an embodiment of the present disclosure provides a front-end circuit including a demultiplexer, a plurality of filters, and the high frequency circuit having the above-described features.

Thus, the front-end circuit can be provided in which high frequency signals at a plurality of frequencies are amplified with high accuracy and the size reduction is realized.

Moreover, to achieve the above-mentioned object, an embodiment of the present disclosure provides a communication device including the front-end circuit having the above-described features, and an RF signal processing circuit.

Thus, the transmission device can be provided in which high frequency signals at a plurality of frequencies are amplified with high accuracy and the size reduction is realized.

According to the present disclosure, the high frequency circuit, the front-end circuit, and the communication device can be provided in each of which high frequency signals at a plurality of frequencies are amplified with high accuracy and the size reduction is realized.

BRIEF DESCRIPTION OF THE SEVERAL VIEWS OF THE DRAWINGS

FIG. 7 illustrates a circuit configuration of a front-end module using a high frequency circuit according to Embodiment 4.

DETAILED DESCRIPTION OF THE DISCLOSURE

Practical examples of the present disclosure will be described in detail below with reference to embodiments and drawings. It is to be noted that any of the embodiments described below represents a generic or specific example. Numerical values, shapes, materials, constituent elements, arrangements and connection forms of the constituent elements, and so on, which are described in the following embodiments, are merely illustrative, and they are not purported to limit the scope of the present disclosure.

Embodiment 1

A front-end module 1 using a high frequency circuit 4 according to this embodiment is disposed in a communication device that is used to transmit or receive a high frequency signal, for example.

[1-1. Configurations of High Frequency Circuit and Front-End Module]

Figure 1:
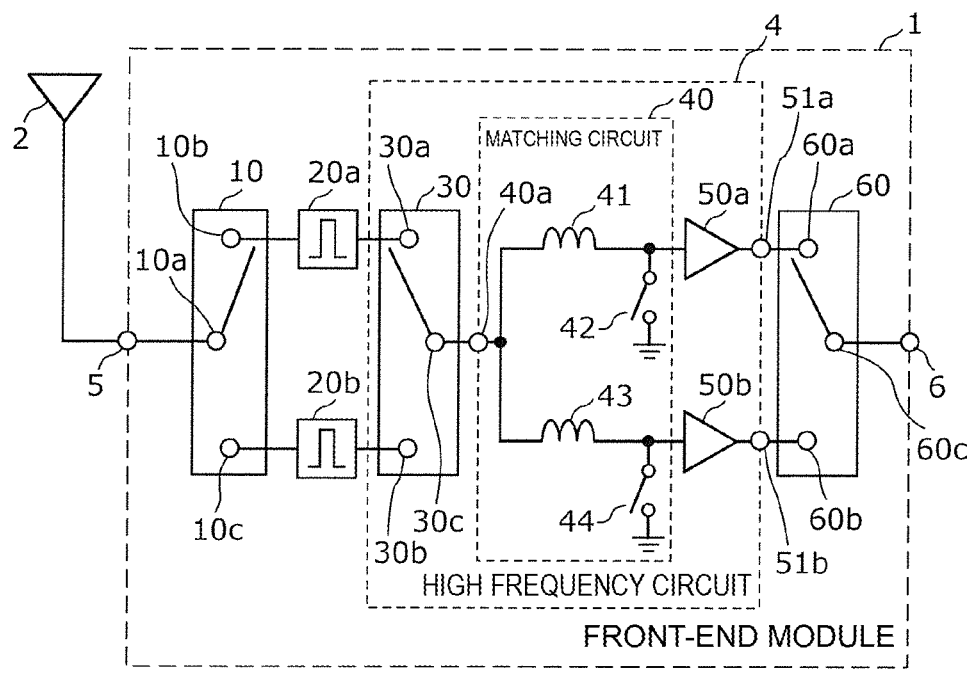
FIG. 1 illustrates a circuit configuration of a front-end module using a high frequency circuit according to Embodiment 1.

First, a configuration of the front-end module 1 using the high frequency circuit 4 according to this embodiment is described. FIG. 1 illustrates a circuit configuration of the front-end module 1 using the high frequency circuit 4 according to this embodiment.

The front-end module 1 is disposed, for example, in a front-end section of a multimode/multiband adaptable cellular phone. As illustrated in FIG. 1, the front-end module 1 is a front-end circuit including an antenna terminal 5, an output terminal 6, a first switch IC 10, filters 20a and 20b, a second switch IC 30, a matching circuit 40, low-noise amplifiers 50a and 50b, and a third switch IC 60. The high frequency circuit 4 includes at least the matching circuit 40 and the low-noise amplifiers 50a and 50b. The matching circuit 40 includes inductors 41 and 43 and switches 42 and 44.

The first switch IC 10 is a demultiplexer for switching a transfer path of a high frequency signal that is inputted to the front-end module 1 from the antenna terminal 5. The first switch IC 10 is a semiconductor switch. The first switch IC 10 has a common terminal 10a and selection terminals 10b and 10c. The common terminal 10a is connected to the antenna terminal 5, and the selection terminals 10b and 10c are connected respectively to the filters 20a and 20b. The first switch IC 10 transfers the signal inputted from the antenna terminal 5 to the filter 20a or 20b by connecting between the common terminal 10a and the selection terminal 10b or between the common terminal 10a and the selection terminal 10c in a switching manner. The number of the selection terminals is optionally set and may be changed as appropriate in accordance with the number of paths to be branched by the demultiplexer. A multiplexer may be arranged instead of the first switch IC 10.

The filters 20a and 20b are filters having different pass bands. The filters 20a and 20b may be each a SAW (Surface Acoustic Wave) filter or a BAW (Bulk Acoustic Wave) filter.

In the case of using the SAW filter, each of the filters 20a and 20b includes a substrate and an IDT (Interdigital transducer) electrode.

The substrate is a substrate having piezoelectricity at least in its surface. For example, the substrate may be constituted as a multilayer body including a piezoelectric thin film formed on a surface, a film in which an acoustic velocity is different from that in the piezoelectric thin film, a support base, and so on. Alternatively, the substrate may have piezoelectricity in its entirety. In the latter case, the substrate is a piezoelectric substrate formed by a single piezoelectric layer.

The filters 20a and 20b are receive filters for filtering, in the individual pass bands, high frequency reception signals that are transferred from an antenna element 2 through the first switch IC 10, and outputting the signals to a next-stage circuit in the front-end module 1. For example, the filter 20a is a receive filter having a first frequency band as the pass band, and it outputs the signal after the filtering to the second switch IC 30 that is the next-stage circuit. The filter 20b is a receive filter having a second frequency band different from the first frequency band as the pass band, and it outputs the high frequency signal after the filtering to the second switch IC 30 that is the next-stage circuit.

The second switch IC 30 is a switch for transferring the high frequency signal having passed through the filter 20a or 20b to the matching circuit 40. The second switch IC 30 is a third switch in this embodiment. The second switch IC 30 is a semiconductor switch. The second switch IC 30 has selection terminals 30a and 30b and one common terminal 30c. Thus, assuming that the number of common terminals arranged in the second switch IC 30 is denoted by N, a number N=1 of common terminal is arranged in the second switch IC 30.

The selection terminals 30a and 30b are connected respectively to the filters 20a and 20b. The common terminal 30c is connected to an input terminal 40a of the matching circuit 40. The second switch IC 30 connects between the selection terminal 30a and the common terminal 30c or between the selection terminal 30b and the common terminal 30c in a switching manner. Accordingly, the high frequency signal after the filtering by the filter 20a or 20b is outputted to the matching circuit 40 through the second switch IC 30.

The matching circuit 40 is a circuit for matching an impedance at the common terminal 30c of the second switch IC 30 and an impedance at each of input terminals of the low-noise amplifiers 50a and 50b. The matching circuit 40 includes the input terminal 40a, the inductors 41 and 43, and the switches 42 and 44. In this embodiment, the input terminal 40a is a first terminal. The input terminal 40a is arranged outside the second switch IC 30. However, the configuration of the input terminal 40a is not limited to the case in which it is arranged outside the second switch IC 30. For example, the common terminal 30c of the second switch IC 30 may be used as the input terminal 40a. In that case, the common terminal 30c is the first terminal.

One ends of the inductors 41 and 43 are connected in common to the input terminal 40a. The other end of the inductor 41 is connected to an input end of the low-noise amplifier 50a. The switch 42 is connected between a reference terminal (ground) and a path between the inductor 41 and the low-noise amplifier 50a. The other end of the inductor 43 is connected to an input end of the low-noise amplifier 50b. The switch 44 is connected between the reference terminal and a path between the inductor 43 and the low-noise amplifier 50b.

The inductors 41 and 43 are each an impedance matching element. The impedance matching element is not limited to the inductor and it may be a capacitor. In this embodiment, the inductors 41 and 43 are respectively a first matching element and a second matching element. The inductors 41 and 43 have different inductance values.

The switches 42 and 44 are semiconductor switches. In this embodiment, the switches 42 and 44 are respectively a first switch and a second switch. The switch 42 is turned to an off-state when the low-noise amplifier 50a described later is in an on-state, and to an on-state when the low-noise amplifier 50a is in an off-state. The switch 44 is turned to an off-state when the low-noise amplifier 50b is in an on-state, and turned to an on-state when the low-noise amplifier 50b is in an off-state. Operations of the switches 42 and 44 will be described in detail later.

The low-noise amplifiers 50a and 50b are amplifiers for amplifying the high frequency reception signals inputted to the front-end module 1. In this embodiment, the low-noise amplifiers 50a and 50b are respectively a first amplifier and a second amplifier. When one of the low-noise amplifiers 50a and 50b is turned to the on-state, the other is turned to the off-state. For example, when the filter 20a is used in accordance with a frequency of the high frequency signal inputted from the antenna element 2, the low-noise amplifier 50a is turned to the on-state and the low-noise amplifier 50b is turned to the off-state. When the filter 20b is used, the low-noise amplifier 50a is turned to the off-state and the low-noise amplifier 50b is turned to the on-state.

The input end of the low-noise amplifier 50a is connected in series to the inductor 41. An output end of the low-noise amplifier 50a is connected to an output terminal 51a. The output terminal 51a is connected to a selection terminal 60a of the third switch IC 60. In this embodiment, the output terminal 51a is a second terminal. The input end of the low-noise amplifier 50b is connected in series to the inductor 43. An output end of the low-noise amplifier 50b is connected to an output terminal 51b. The output terminal 51b is connected to a selection terminal 60b of the third switch IC 60. In this embodiment, the output terminal 51b is a third terminal.

The third switch IC 60 is a switch for transferring the high frequency signal having passed through the low-noise amplifier 50a or 50b to the output terminal 6. The third switch IC 60 has the selection terminals 60a and 60b and a common terminal 60c. The selection terminals 60a and 60b are, as described above, connected respectively to the low-noise amplifiers 50a and 50b. The common terminal 60c is connected to the output terminal 6. The third switch IC 60 connects between the selection terminal 60a and the common terminal 60c or between the selection terminal 60b and the common terminal 60c in a switching manner. Accordingly, the high frequency signal having passed through the low-noise amplifier 50*a* or 50*b* is outputted to the next-stage circuit in the front-end module 1 through the third switch IC 60 and the output terminal 6.

The front-end module 1 may be a front-end module constituting only a reception demultiplexer circuit or a front-end module constituting only a transmission multiplexer circuit. Alternatively, as described above, the front-end module 1 may be a demultiplexer/multiplexer circuit capable of performing both transmission and reception. The number of frequency bands (signal paths) capable of being handled by the front-end module 1 is not limited.

Furthermore, the front-end module 1 may be designed in configuration including the first switch IC 10 or not including the first switch IC 10. Similarly, the front-end module 1 may be designed in configuration including the third switch IC 60 or not including the third switch IC 60. The front-end module 1 may be designed in configuration including two filters, i.e., the filters 20*a* and 20*b*, as described above or including three or more filters. The front-end module 1 may be designed in configuration including two low-noise amplifiers, i.e., the low-noise amplifiers 50*a* and 50*b*, as described above or including three or more low-noise amplifiers. The front-end module 1 may be designed in configuration including a power amplifier or not including the power amplifier.

[1-2. Operation of Front-End Module]

Figure 2A:
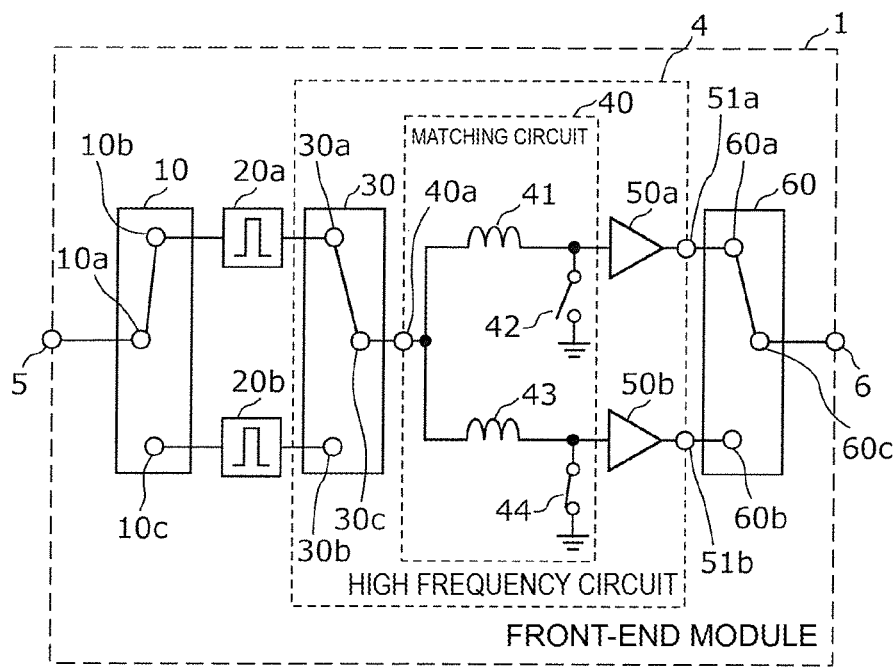
FIG. 2A illustrates an operating state of the front-end module using the high frequency circuit according to Embodiment 1.
Figure 2B:
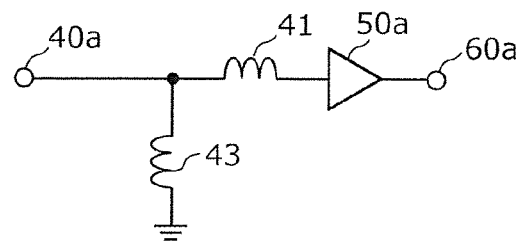
FIG. 2B is an equivalent circuit diagram of the high frequency circuit illustrated in FIG. 2A.
Figure 3A:
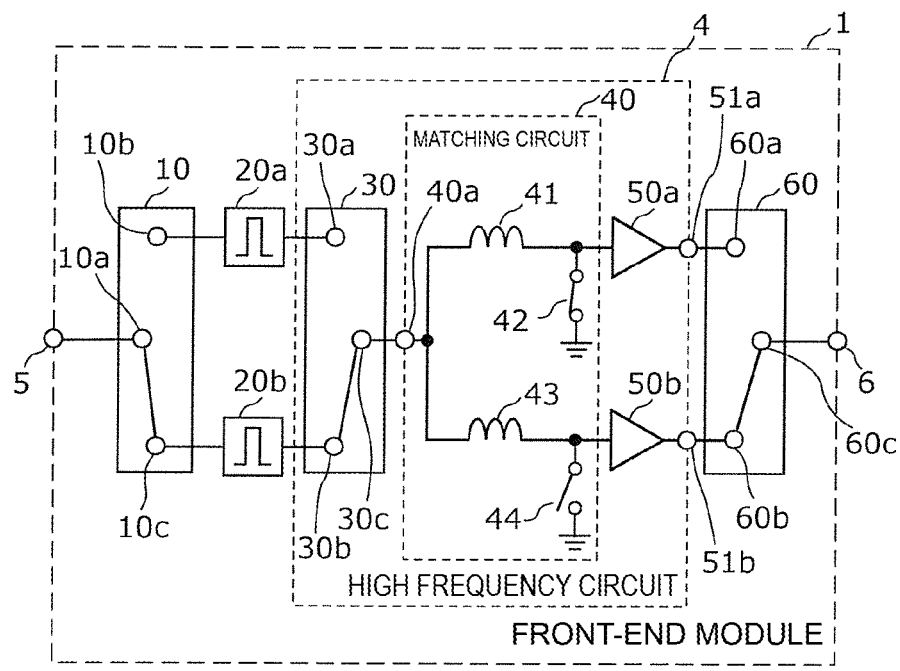
FIG. 3A illustrates an operating state of the front-end module using the high frequency circuit according to Embodiment 1.
Figure 3B:
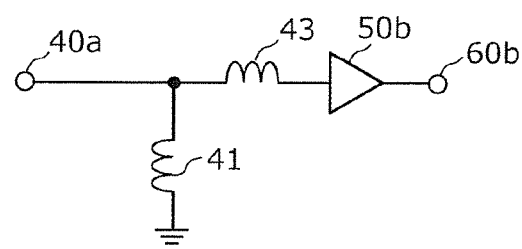
FIG. 3B is an equivalent circuit diagram of the high frequency circuit illustrated in FIG. 3A.

Operation of the front-end module 1 will be described below with reference to FIGS. 2A to 3B. FIG. 2A illustrates an operating state of the front-end module 1 using the high frequency circuit 4 according to this embodiment. FIG. 2B is an equivalent circuit diagram of the high frequency circuit 4 illustrated in FIG. 2A. FIG. 3A illustrates an operating state of the front-end module 1 using the high frequency circuit 4 according to this embodiment. FIG. 3B is an equivalent circuit diagram of the high frequency circuit 4 illustrated in FIG. 3A.

FIG. 2A illustrates the operating state of the front-end module 1 when the filter 20*a* and the low-noise amplifier 50*a* are used. In this case, as illustrated in FIG. 2A, the common terminal 10*a* is connected to the selection terminal 10*b* in the first switch IC 10. In the second switch IC 30, the common terminal 30*c* is connected to the selection terminal 30*a*. In the matching circuit 40, the switch 42 is turned to the off-state, and the switch 44 is turned to the on-state. Moreover, the low-noise amplifier 50*a* is turned to the on-state, and the low-noise amplifier 50*b* is turned to the off-state. In the third switch IC 60, the common terminal 60*c* is connected to the selection terminal 60*a*. A path between the input terminal 40*a* of the matching circuit 40 and the output terminal 51*a* connected to the output side of the low-noise amplifier 50*a* in this case is a first path. In other words, the high frequency signal received by the antenna element 2 and having the first frequency band is transferred through the first path.

In the equivalent circuit representing the first path, as illustrated in FIG. 2B, the inductor 41 and the low-noise amplifier 50*a* are connected in series between the input terminal 40*a* and the output terminal 51*a*. Furthermore, the inductor 43 is connected between the reference terminal and a path between the input terminal 40*a* and the inductor 41. With such an arrangement, the matching circuit 40 can perform the impedance matching on the input side of the low-noise amplifier 50*a* with the inductor 41 and the inductor 43.

Similarly, FIG. 3A illustrates the operating state of the front-end module 1 when the filter 20*b* and the low-noise amplifier 50*b* are used. In this case, as illustrated in FIG. 3A, the common terminal 10*a* is connected to the selection terminal 10*c* in the first switch IC 10. In the second switch IC 30, the common terminal 30*c* is connected to the selection terminal 30*b*. Moreover, the low-noise amplifier 50*a* is turned to the off-state, and the low-noise amplifier 50*b* is turned to the on-state. In the third switch IC 60, the common terminal 60*c* is connected to the selection terminal 60*b*. In addition, the switch 42 is turned to the on-state, and the switch 44 is turned to the off-state. A path between the input terminal 40*a* of the matching circuit 40 and the output terminal 51*b* connected to the output side of the low-noise amplifier 50*b* in this case is a second path. In other words, the high frequency signal received by the antenna element 2 and having the second frequency band is transferred through the second path.

In the equivalent circuit representing the second path, as illustrated in FIG. 3B, the inductor 43 and the low-noise amplifier 50*b* are connected in series between the input terminal 40*a* and the output terminal 51*b*. Furthermore, the inductor 41 is connected between the reference terminal and a path between the input terminal 40*a* and the inductor 43. With such an arrangement, the matching circuit 40 can perform the impedance matching on the input side of the low-noise amplifier 50*b* with the inductor 41 and the inductor 43. The impedance of the matching circuit 40 in this case is different from that of the matching circuit 40 illustrated in the equivalent circuit of FIG. 2B.

Thus, in the front-end module 1, the two low-noise amplifiers 50*a* and 50*b* are used with respect to the two filters 20*a* and 20*b*, and the two inductors 41 and 43 are used as the matching circuit 40. By selectively turning on/off the switches 42 and 44, the matching circuit 40 is constituted with the common use of both the inductors 41 and 43 when any one of the low-noise amplifiers 50*a* and 50*b* is used. In the front-end module 1, therefore, the number of matching elements used in the matching circuit 40, namely the number of matching elements used in the high frequency circuit, can be reduced in comparison with that required when the matching circuit is arranged per band.

Figure 4A:
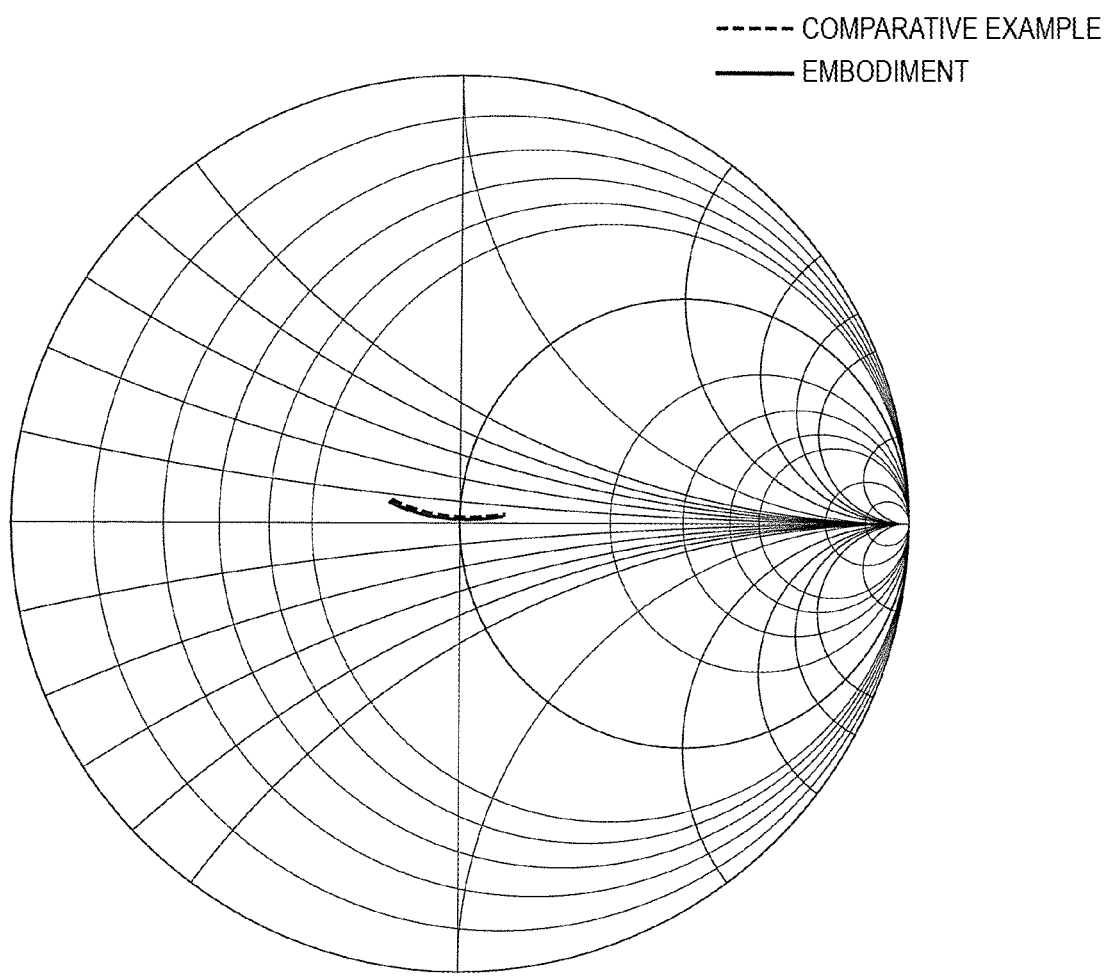
FIG. 4A is a chart depicting impedance matching characteristics of the front-end module using the high frequency circuit according to Embodiment 1.
Figure 4B:
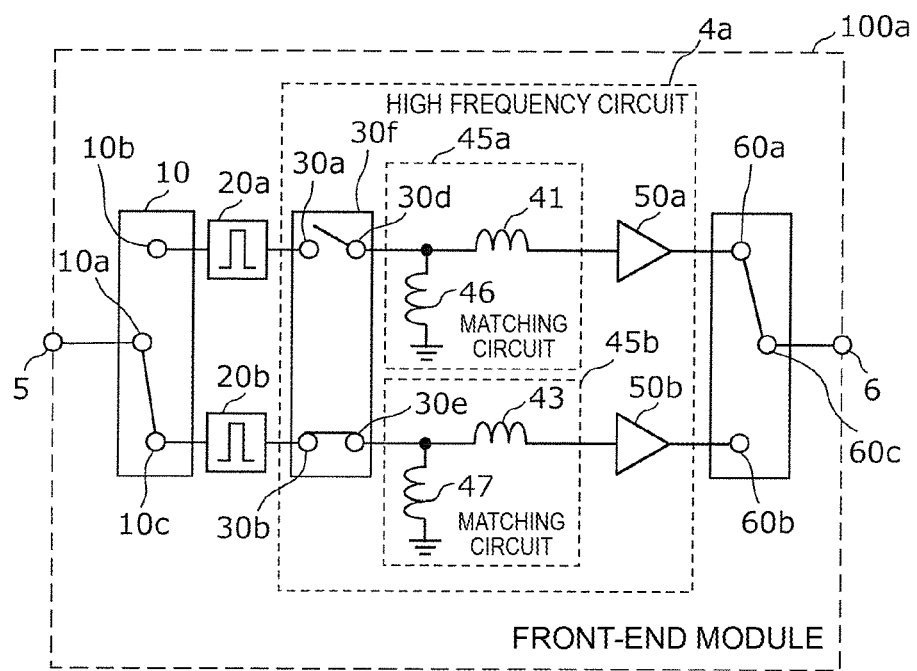
FIG. 4B is an equivalent circuit diagram of a high frequency circuit according to Comparative Example.

FIG. 4A is a chart depicting impedance matching characteristics of the front-end module 1 described in this embodiment. FIG. 4B is an equivalent circuit diagram of a high frequency circuit according to Comparative Example. "Embodiment" indicates the impedance matching characteristics of the front-end module 1 when the circuit configuration of FIG. 3B is obtained by turning the switch 42 to the on-state and turning the switch 44 to the off-state as illustrated in FIG. 3A. "Comparative Example" indicates impedance matching characteristics of a front-end module 100*a* in which, as illustrated in FIG. 4B, a matching circuit 45*a* is disposed in a path between a terminal 30*g* of a second switch IC 30*d* and the low-noise amplifier 50*a* and a matching circuit 45*b* is disposed in a path between a terminal 30*h* of the second switch IC 30*d* and the low-noise amplifier 50*b*.

In a high frequency circuit 4*a* according to Comparative Example, the matching circuit 45*a* includes, instead of using the switch 42 illustrated in FIG. 2A, an inductor 46 arranged between the reference terminal and a path between the terminal 30*g* of the second switch IC 30*d* and the inductor 41. The matching circuit 45*b* includes, instead of using the switch 44 illustrated in FIG. 2A, an inductor 47 arranged between the reference terminal and a path between the terminal 30*h* of the second switch IC 30*d* and the inductor 43. Furthermore, in the first switch IC 10, the common terminal 10*a* and the selection terminal 10*c* are connected. In the second switch IC 30*d*, the selection terminal 30*a* and the terminal 30g are not connected, and the selection terminal 30b and the terminal 30h are connected.

Comparing the characteristics of Embodiment and the characteristics of Comparative Example, substantially identical characteristics are obtained as seen from FIG. 4A. It is hence understood that the impedance matching can be performed as in the related art even when the matching circuit is constituted by selectively turning on/off the switches 42 and 44 as described in the matching circuit 40 according to this embodiment.

Furthermore, in the matching circuit 40, since the inductor 41 and the inductor 43 have different inductance values, an inductance value in the matching circuit 40 can be made different between the case in which the switch 42 is turned to the on-state and the switch 44 is turned to the off-state and the case in which the switch 42 is turned to the off-state and the switch 44 is turned to the on-state. Thus, the impedance of the matching circuit 40 can be changed depending on which one of the low-noise amplifier 50a or 50b is used, and appropriate impedance matching can be performed.

[1-3. Advantageous Effects and Others]

As described above, the front-end module 1 according to this embodiment can change the impedance of the matching circuit 40 depending on which one of the low-noise amplifier 50a or 50b is used and can perform the appropriate impedance matching.

Embodiment 2

Figure 5:
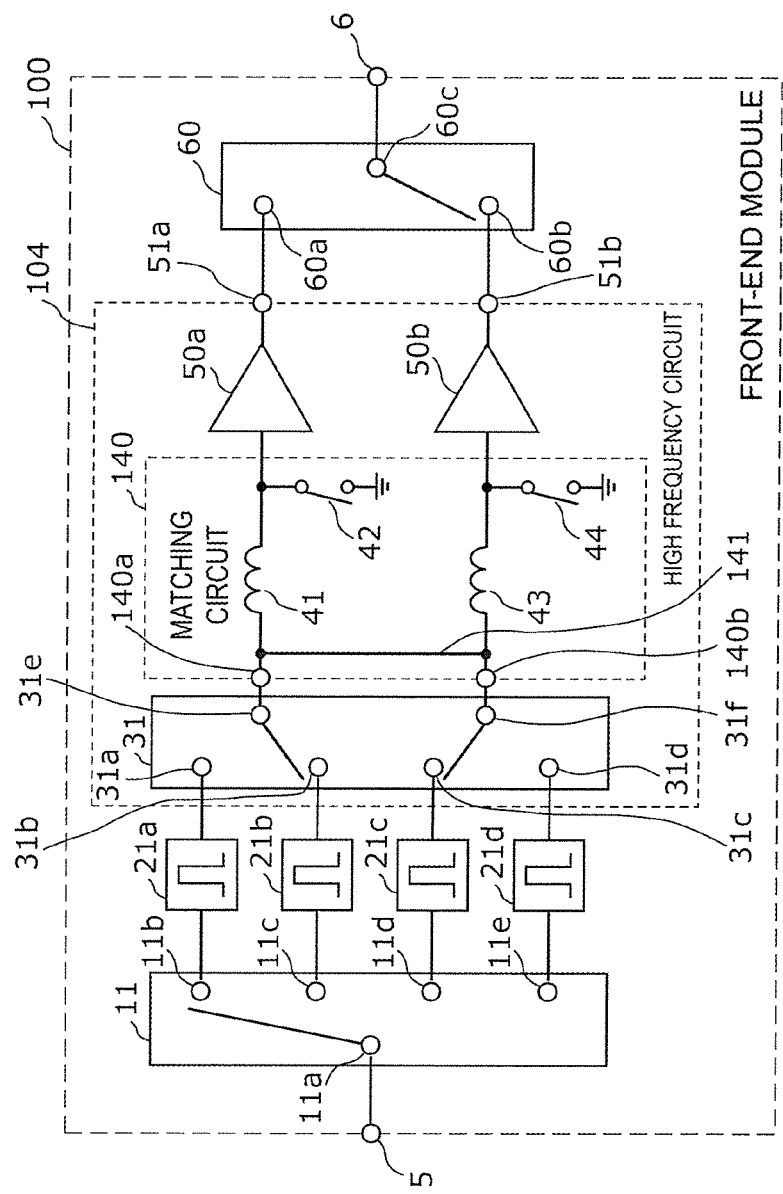
FIG. 5 illustrates a circuit configuration of a front-end module using a high frequency circuit according to Embodiment 2.

A front-end module 100 using a high frequency circuit 104 according to Embodiment 2 will be described below. FIG. 5 illustrates a circuit configuration of the front-end module 100 using the high frequency circuit 104 according to this embodiment.

The front-end module 100 according to this embodiment is different from the front-end module 1 according to Embodiment 1 in that a switch IC connected to a preceding stage (on the side closer to the antenna terminal 5) of a matching circuit has a plurality of common terminals and the matching circuit has a plurality of input terminals.

[2-1. Configuration of Front-End Module]

As illustrated in FIG. 5, the front-end module 100 is a front-end circuit including an antenna terminal 5, an output terminal 6, a first switch IC 11, filters 21a, 21b, 21c and 21d, a second switch IC 31, a matching circuit 140, low-noise amplifiers 50a and 50b, and a third switch IC 60. The high frequency circuit 104 is constituted by the matching circuit 140 and the low-noise amplifiers 50a and 50b. The low-noise amplifiers 50a and 50b and the third switch IC 60 have the same configurations as those of the low-noise amplifiers 50a and 50b and the third switch IC 60 described in Embodiment 1, and hence the detailed description of those components is omitted.

The first switch IC 11 is a demultiplexer for switching a transfer path of a high frequency signal that is inputted to the front-end module 100 from the antenna terminal 5. The first switch IC 11 has a common terminal 11a and selection terminals 11b, 11c, 11d and 11e. The common terminal 11a is connected to the antenna terminal 5, and the selection terminals 11b, 11c, 11d and 11e are connected respectively to the filters 21a, 21b, 21c and 21d. The first switch IC 11 transfers the high frequency signal inputted from the antenna terminal 5 to any one of the filters 21a, 21b, 21c and 21d by connecting between the common terminal 11a and any one of the selection terminal 11b, 11c, 11d and 11e in a switching manner.

The first switch IC 11 is a semiconductor switch, for example, like the first switch IC 10 described in Embodiment 1. The number of the selection terminals is optionally set and may be changed as appropriate in accordance with the number of paths to be branched by the demultiplexer.

The filters 21a, 21b, 21c and 21d are filters having different pass bands. The filters 21a, 21b, 21c and 21d are each constituted by a Surface Acoustic Wave filter, for example. The filters 21a, 21b, 21c and 21d are receive filters for filtering, in the individual pass bands, high frequency reception signals transferred from the antenna element 2 through the first switch IC 11, and outputting the signals to a next-stage circuit in the front-end module 100.

The high frequency signals after the filtering by the filters 21a, 21b, 21c and 21d are outputted respectively to selection terminals 31a, 31b, 31c and 31d of the second switch IC 31 that is the next-stage circuit.

The second switch IC 31 is a switch for transferring the high frequency signal having passed through the filter 21a, 21b, 21c or 21d to the matching circuit 140. The second switch IC 31 is the third switch in this embodiment. The second switch IC 31 is a semiconductor switch like the second switch IC 30 described in Embodiment 1. The second switch IC 31 has the selection terminals 31a, 31b, 31c and 31d and common terminals 31e and 31f. Thus, a number N=2 of common terminals are arranged in the second switch IC 31.

The selection terminals 31a, 31b, 31c and 31d are connected respectively to the filters 21a, 21b, 21c and 21d. The common terminal 31e is connected to an input terminal 140a of the matching circuit 140. The common terminal 31f is connected to an input terminal 140b of the matching circuit 140. The second switch IC 31 connects between the common terminal 31e and the selection terminal 31a or 31b in a switching manner. Similarly, the second switch IC 31 connects between the common terminal 31f and the selection terminal 31c or 31d in a switching manner. Accordingly, the high frequency signal having passed through the filter 21a or 21b is outputted to the input terminal 140a of the matching circuit 140 through the second switch IC 31. The high frequency signal having passed through the filter 21c or 21d is outputted to the input terminal 140b of the matching circuit 140 through the second switch IC 31.

The matching circuit 140 includes the input terminals 140a and 140b, the inductors 41 and 43, and the switches 42 and 44. In this embodiment, the input terminals 140a and 140b are each the first terminal. The input terminals 140a and 140b may be arranged outside the second switch IC 31. In another example, the common terminals 31e and 31f of the second switch IC 31 may be used as the input terminals 140a and 140b, respectively. In that case, the common terminals 31e and 31f are each the first terminal.

One end of the inductor 41 is connected to the input terminal 140a. One end of the inductor 43 is connected to the input terminal 140b. A path connecting the input terminal 140a and the inductor 41 and a path connecting the input terminal 140b and the inductor 43 are connected by a wiring 141. Thus, the input terminals 140a and 140b are electrically connected to each other.

The other configuration of the matching circuit 140 is similar to that of the matching circuit 40 described in Embodiment 1, and hence the description of the other configuration is omitted.

With the above-described configuration, the front-end module 100 inputs the high frequency signal having passed through the filter 21a or 21b to the low-noise amplifier 50a through the second switch IC 31. Moreover, the front-end module 100 inputs the high frequency signal having passed through the filter 21c or 21d to the low-noise amplifier 50b through the second switch IC 31. In addition, the front-end module 100 can perform the impedance matching suitable for the low-noise amplifier 50a or 50b in use by controlling the switches 42 and 44.

The front-end module 100 may be a front-end module constituting only a reception demultiplexer circuit or a front-end module constituting only a transmission multiplexer circuit. Alternatively, the front-end module 100 may be a demultiplexer/multiplexer circuit capable of performing both transmission and reception. The number of frequency bands (signal paths) capable of being handled by the front-end module 100 is not limited.

Furthermore, the front-end module 100 may be designed in configuration including the first switch IC 11 or not including the first switch IC 11. Similarly, the front-end module 100 may be designed in configuration including the third switch IC 60 or not including the third switch IC 60.

[2-2. Operation of Front-End Module]

Operation of the front-end module 100 will be described below.

When the high frequency signal in the frequency band of the filter 21a is received at the antenna terminal 5, the common terminal 11a is connected to the selection terminal 11b in the first switch IC 11. Accordingly, the received high frequency signal is inputted to the filter 21a through the common terminal 11a and the selection terminal 11b of the first switch IC 11. In the second switch IC 31, the common terminal 31e is connected to the selection terminal 31a. The common terminal 31f is not connected to any of the selection terminals 31c and 31d.

When the high frequency signal in the frequency band of the filter 21b is received at the antenna terminal 5, the common terminal 11a is connected to the selection terminal 11c in the first switch IC 11. Accordingly, the received high frequency signal is inputted to the filter 21b through the common terminal 11a and the selection terminal 11c of the first switch IC 11. In the second switch IC 31, the common terminal 31e is connected to the selection terminal 31b. The common terminal 31f is not connected to any of the selection terminals 31c and 31d.

When the high frequency signal in the frequency band of the filter 21a or 21b is inputted to the antenna terminal 5, the switch 42 is turned to the off-state and the switch 44 is turned to the on-state in the matching circuit 140. Moreover, the low-noise amplifier 50a is turned to the on-state, and the low-noise amplifier 50b is turned to the off-state. In the third switch IC 60, the common terminal 60c is connected to the selection terminal 60a. A path between the input terminal 140a of the matching circuit 140 and the output terminal 51a connected to the output side of the low-noise amplifier 50a in this case is the first path.

In other words, the inductor 41 and the low-noise amplifier 50a are connected in series between the input terminal 140a and the output terminal 51a. Furthermore, the inductor 43 is connected between the reference terminal and a path between the input terminal 140a and the inductor 41. With such an arrangement, the matching circuit 140 can perform the impedance matching on the input side of the low-noise amplifier 50a with the inductor 41 and the inductor 43.

When the high frequency signal in the frequency band of the filter 21c is inputted to the antenna terminal 5, the common terminal 11a is connected to the selection terminal 11d in the first switch IC 11. Accordingly, the received high frequency signal is inputted to the filter 21c through the common terminal 11a and the selection terminal 11d of the first switch IC 11. In the second switch IC 31, the common terminal 31f is connected to the selection terminal 31c. The common terminal 31e is not connected to any of the selection terminals 31a and 31b.

When the high frequency signal in the frequency band of the filter 21d is received at the antenna terminal 5, the common terminal 11a is connected to the selection terminal 11e in the first switch IC 11. Accordingly, the received high frequency signal is inputted to the filter 21d through the common terminal 11a and the selection terminal 11e of the first switch IC 11. In the second switch IC 31, the common terminal 31f is connected to the selection terminal 31d. The common terminal 31e is not connected to any of the selection terminals 31a and 31b.

When the high frequency signal in the frequency band of the filter 21c or 21d is received at the antenna terminal 5, the switch 42 is turned to the on-state and the switch 44 is turned to the off-state in the matching circuit 140. Moreover, the low-noise amplifier 50a is turned to the off-state, and the low-noise amplifier 50b is turned to the on-state. In the third switch IC 60, the common terminal 60c is connected to the selection terminal 60b. A path between the input terminal 140b of the matching circuit 140 and the output terminal 51b connected to the output side of the low-noise amplifier 50b in this case is the second path.

In other words, the inductor 43 and the low-noise amplifier 50b are connected in series between the input terminal 140b and the output terminal 51b. Furthermore, the inductor 41 is connected between the reference terminal and a path between the input terminal 140b and the inductor 43. With such an arrangement, the matching circuit 140 can perform the impedance matching on the input side of the low-noise amplifier 50b with the inductor 41 and the inductor 43. The impedance of the matching circuit 140 in this case is different from that of the matching circuit 140 when the impedance matching is performed on the input end of the low-noise amplifier 50a.

Thus, in the front-end module 100, the two low-noise amplifiers 50a and 50b are used with respect to the four filters 21a, 21b, 21c and 21d, and the two inductors 41 and 43 are used as the matching circuit 140. By selectively turning on/off the switches 42 and 44, the impedance matching is performed with the common use of both the inductors 41 and 43 when any one of the low-noise amplifiers 50a and 50b is used. In the front-end module 100, therefore, the number of inductors and switches used in the matching circuit 140 can be further reduced.

[2-3. Advantageous Effects and Others]

As described above, with the front-end module 100 according to this embodiment, even when the number of filters is increased, there is no necessity of increasing the numbers of inductors, switches, and low-noise amplifiers used in the matching circuit 140 depending on the number of filters. In the front-end module 100, therefore, the number of inductors and switches used in the matching circuit 140 can be reduced and the size reduction can be realized.

Embodiment 3

Figure 6:
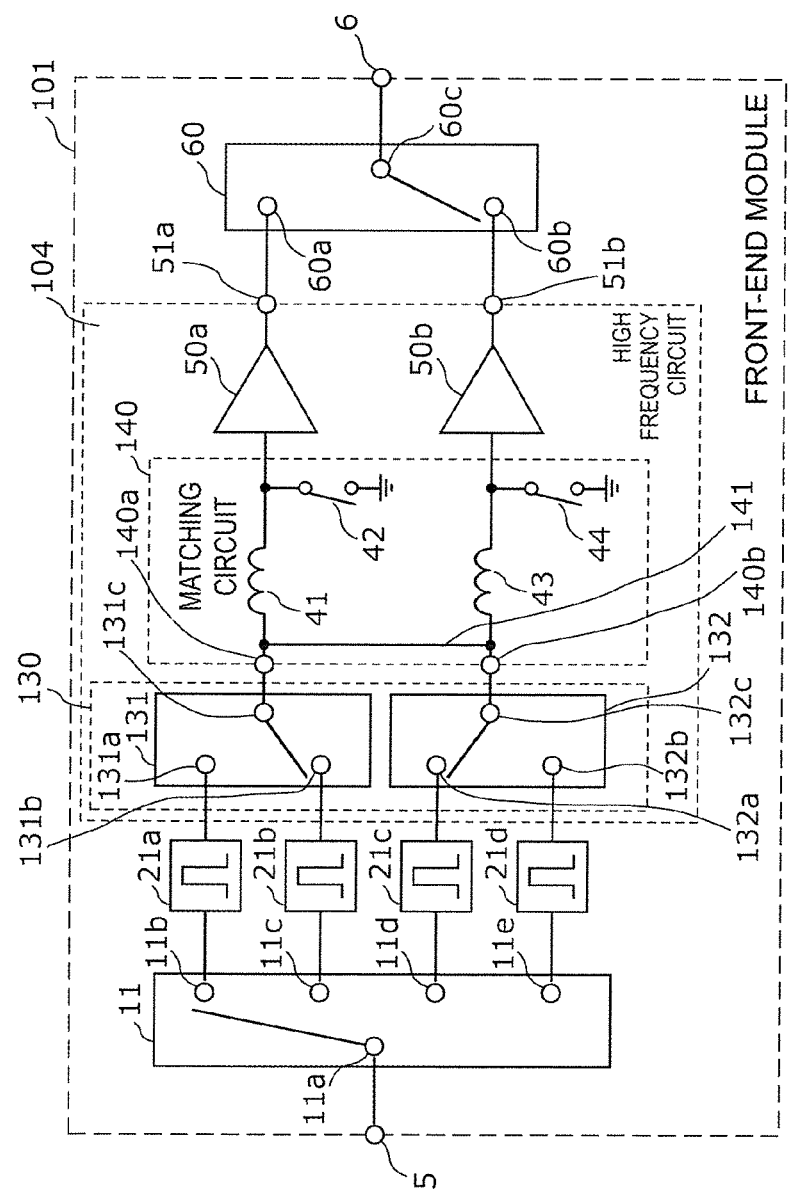
FIG. 6 illustrates a circuit configuration of a front-end module using a high frequency circuit according to Embodiment 3.

A front-end module 101 using a high frequency circuit 104 according to Embodiment 3 will be described below. FIG. 6 illustrates a circuit configuration of the front-end module 101 using the high frequency circuit 104 according to this embodiment.

The front-end module 101 according to this embodiment is different from the front-end module 100 according to Embodiment 2 in that a switch unit constituted by a plurality of switch ICs is disposed in a preceding stage of a matching circuit.

[3-1. Configuration of Front-End Module]

As illustrated in FIG. 6, the front-end module 101 is a front-end circuit including an antenna terminal 5, an output terminal 6, a first switch IC 11, filters 21a, 21b, 21c and 21d, a switch unit 130, a matching circuit 140, low-noise amplifiers 50a and 50b, and a third switch IC 60. The high frequency circuit 104 is constituted by the matching circuit 140 and the low-noise amplifiers 50a and 50b. The first switch IC 11, the filters 21a, 21b, 21c and 21d, the matching circuit 140, the low-noise amplifiers 50a and 50b, and the third switch IC 60 have the same configurations as those of the matching circuit 140, the low-noise amplifiers 50a and 50b, and the third switch IC 60 described in Embodiment 2, and hence the detailed description of those components is omitted.

The switch unit 130 includes two second switches IC 131 and 132.

The second switch IC 131 is a switch for transferring the high frequency signal having passed through the filter 21a or 21b to the matching circuit 140. The second switch IC 131 is the third switch in this embodiment. The second switch IC 131 is a semiconductor switch like the second switch IC 30 described in Embodiment 1. The second switch IC 131 has selection terminals 131a and 131b and a common terminal 131c.

The selection terminals 131a and 131b are connected respectively to the filters 21a and 21b. The common terminal 131c is connected to an input terminal 140a of the matching circuit 140. The second switch IC 131 connects between the common terminal 131c and the selection terminal 131a or 131b in a switching manner. Accordingly, the high frequency signal having passed through the filter 21a or 21b is outputted to the input terminal 140a of the matching circuit 140 through the second switch IC 131.

The second switch IC 132 is a switch for transferring the high frequency signal having passed through the filter 21c or 21d to the matching circuit 140. The second switch IC 132 is the third switch in this embodiment. The second switch IC 132 is a semiconductor switch like the second switch IC 131 and is formed inside an IC substrate (not illustrated) or on the IC substrate. The second switch IC 132 has selection terminals 132a and 132b and a common terminal 132c.

The selection terminals 132a and 132b are connected respectively to the filters 21c and 21d. The common terminal 132c is connected to an input terminal 140b of the matching circuit 140. The second switch IC 132 connects between the common terminal 132c and the selection terminal 132a or 132b in a switching manner. Accordingly, the high frequency signal having passed through the filter 21c or 21d is outputted to the input terminal 140b of the matching circuit 140 through the second switch IC 132.

With the above-described configuration, the front-end module 101 inputs the high frequency signal having passed through the filter 21a or 21b to the low-noise amplifier 50a through the second switch IC 131. Moreover, the front-end module 101 inputs the high frequency signal having passed through the filter 21c or 21d to the low-noise amplifier 50b through the second switch IC 132. In addition, the front-end module 101 can perform the impedance matching suitable for the low-noise amplifier 50a or 50b in use by controlling the switches 42 and 44.

The front-end module 101 may be a front-end module constituting only a reception demultiplexer circuit or a front-end module constituting only a transmission multiplexer circuit. Alternatively, the front-end module 101 may be a demultiplexer/multiplexer circuit capable of performing both transmission and reception. The number of frequency bands (signal paths) capable of being handled by the front-end module 101 is not limited.

Furthermore, the front-end module 100 may be designed in configuration including the first switch IC 11 or not including the first switch IC 11. Similarly, the front-end module 100 may be designed in configuration including the third switch IC 60 or not including the third switch IC 60.

[3-2. Operation of Front-End Module]

Operation of the front-end module 101 will be described below. Operations of the first switch IC 11 and the filters 21a, 21b, 21c and 21d are similar to the operations of the first switch IC 11 and the filters 21a, 21b, 21c and 21d described in Embodiment 2, and hence the description of those operations is omitted.

When the high frequency signal in the frequency band of the filter 21a or 21b is received at the antenna terminal 5, the switch 42 is turned to the off-state and the switch 44 is turned to the on-state in the matching circuit 140. Moreover, the low-noise amplifier 50a is turned to the on-state, and the low-noise amplifier 50b is turned to the off-state. In the third switch IC 60, the common terminal 60c is connected to the selection terminal 60a. A path between the input terminal 140a of the matching circuit 140 and the output terminal 51a connected to the output side of the low-noise amplifier 50a in this case is the first path.

In other words, the inductor 41 and the low-noise amplifier 50a are connected in series between the input terminal 140a and the output terminal 51a. Furthermore, the inductor 43 is connected between the reference terminal and a path between the input terminal 140a and the inductor 41. With such an arrangement, the matching circuit 140 can perform the impedance matching on the input side of the low-noise amplifier 50a with the inductor 41 and the inductor 43.

When the high frequency signal in the frequency band of the filter 21c or 21d is received at the antenna terminal 5, the switch 42 is turned to the on-state and the switch 44 is turned to the off-state in the matching circuit 140. Moreover, the low-noise amplifier 50a is turned to the off-state, and the low-noise amplifier 50b is turned to the on-state. In the third switch IC 60, the common terminal 60c is connected to the selection terminal 60b. A path between the input terminal 140b of the matching circuit 140 and the output terminal 51b connected to the output side of the low-noise amplifier 50b in this case is the second path.

In other words, the inductor 43 and the low-noise amplifier 50b are connected in series between the input terminal 140b and the output terminal 51b. Furthermore, the inductor 41 is connected between the reference terminal and a path between the input terminal 140b and the inductor 43. With such an arrangement, the matching circuit 140 can perform the impedance matching on the input side of the low-noise amplifier 50b with the inductor 41 and the inductor 43. The impedance of the matching circuit 140 in this case is different from that of the matching circuit 140 when the impedance matching is performed on the input side of the low-noise amplifier 50a.

Thus, in the front-end module 101, the two low-noise amplifiers 50a and 50b are used with respect to the four filters 21a, 21b, 21c and 21d, and the two inductors 41 and 43 are used as the matching circuit 140. By selectively turning on/off the switches 42 and 44, the impedance matching is performed with the common use of the inductors 41 and 43 when any one of the low-noise amplifiers 50a and 50b is used. In the front-end module 101, therefore, the number of inductors and switches used in the matching circuit 140 can be reduced. Moreover, since a different switch IC is used for each group of multiple filters, a possibility of mixing of signals other than the received high frequency signal is low, and the noise can be reduced.

[3-3. Advantageous Effects and Others]

As described above, with the front-end module 101 according to this embodiment, even when the number of filters is increased, there is no necessity of increasing the numbers of inductors, switches, and low-noise amplifiers used in the matching circuit 140 depending on the number of filters. In the front-end module 101, therefore, the number of inductors and switches used in the matching circuit 140 can be reduced and the size reduction can be realized. In addition, the mixing of signals other than the received high frequency signal can be suppressed.

Embodiment 4

A front-end module 200 using a high frequency circuit 204 according to Embodiment 4 will be described below. FIG. 7 illustrates a circuit configuration of the front-end module 200 using the high frequency circuit 204 according to this embodiment.

The front-end module 200 according to this embodiment is different from the front-end module 100 according to Embodiment 2 in that configurations of a matching circuit and a second switch IC connected to a preceding stage of the matching circuit are different from those of the matching circuit 40 and the second switch IC 31 in Embodiment 2.

[4-1. Configuration of Front-End Module]

As illustrated in FIG. 7, the front-end module 200 is a front-end circuit including an antenna terminal 5, an output terminal 6, a first switch IC 11, filters 21*a*, 21*b*, 21*c* and 21*d*, a second switch IC 230, a matching circuit 240, low-noise amplifiers 250*a*, 250*b*, 250*c* and 250*d*, and a third switch IC 260. The high frequency circuit 204 is constituted by the matching circuit 240 and the low-noise amplifiers 250*a*, 250*b*, 250*c* and 250*d*. The first switch IC 11 and the filters 21*a*, 21*b*, 21*c* and 21*d* have the same configurations as those of the first switch IC 11 and the filters 21*a*, 21*b*, 21*c* and 21*d* described in Embodiment 2, and hence the detailed description of those components is omitted.

The second switch IC 230 is a switch for transferring the high frequency signal having passed through the filter 21*a*, 21*b*, 21*c* or 21*d* to the matching circuit 240. The second switch IC 230 is the third switch in this embodiment. The second switch IC 230 is a semiconductor switch like the second switch IC 30 described in Embodiment 1 and is formed inside an IC substrate (not illustrated) or on the IC substrate. The second switch IC 230 has selection terminals 231*a*, 231*b*, 231*c* and 231*d* and four common terminals 232*a*, 232*b*, 232*c* and 232*d*. Thus, a number N=4 of common terminals are arranged in the second switch IC 230.

The selection terminals 231*a*, 231*b*, 231*c* and 231*d* are connected respectively to the filters 21*a*, 21*b*, 21*c* and 21*d*. The common terminals 232*a*, 232*b*, 232*c* and 232*d* are connected respectively to input terminals 240*a*, 240*b*, 240*c* and 240*d* of the matching circuit 240. The second switch IC 230 switches each of connection states between the selection terminal 231*a* and the common terminal 232*a*, between the selection terminal 231*b* and the common terminal 232*b*, between the selection terminal 231*c* and the common terminal 232*c*, and between the selection terminal 231*d* and the common terminal 232*d* to an on-state or an off-state. Accordingly, the high frequency signals having passed through the filter 21*a*, 21*b*, 21*c* and 21*d* are outputted respectively to the input terminals 240*a*, 240*b*, 240*c* and 240*d* of the matching circuit 240 through the second switch IC 230.

The matching circuit 240 includes the input terminals 240*a*, 240*b*, 240*c* and 240*d*, inductors 241, 243, 245 and 247, and switches 242, 244, 246 and 248. Inductance values of the inductors 241, 243, 245 and 247 are different from one another. In this embodiment, the input terminals 240*a*, 240*b*, 240*c* and 240*d* are each the first terminal. The input terminals 240*a*, 240*b*, 240*c* and 240*d* may be arranged outside the second switch IC 230. In another example, the common terminals 232*a*, 232*b*, 232*c* and 232*d* of the second switch IC 230 may be used as the input terminals 240*a*, 240*b*, 240*c* and 240*d*, respectively. In that case, the common terminals 232*a*, 232*b*, 232*c* and 232*d* are each the first terminal.

One ends of the inductors 241, 243, 245 and 247 are connected respectively to the input terminals 240*a*, 240*b*, 240*c* and 240*d*. The other ends of the inductors 241, 243, 245 and 247 are connected respectively to the low-noise amplifiers 250*a*, 250*b*, 250*c* and 250*d*.

The switch 242 is connected between the reference terminal and a path between the inductor 241 and the low-noise amplifier 250*a*. The switch 244 is connected between the reference terminal and a path between the inductor 243 and the low-noise amplifier 250*b*. The switch 246 is connected between the reference terminal and a path between the inductor 245 and the low-noise amplifier 250*c*. The switch 248 is connected between the reference terminal and a path between the inductor 247 and the low-noise amplifier 250*d*.

Furthermore, a path between the input terminal 240*a* and the inductor 241, a path between the input terminal 240*b* and the inductor 243, a path between the input terminal 240*c* and the inductor 245, and a path between the input terminal 240*d* and the inductor 247 are interconnected by wirings 249*a*, 249*b* and 249*c*. Thus, the input terminals 240*a*, 240*b*, 240*c* and 240*d* are electrically connected to one another.

As described above, the input sides of the low-noise amplifiers 250*a*, 250*b*, 250*c* and 250*d* are connected to the inductors 241, 243, 245 and 247, respectively.

The third switch IC 260 has selection terminals 260*a*, 260*b*, 260*c* and 260*d* and a common terminal 260*e*. The selection terminals 260*a*, 260*b*, 260*c* and 260*d* of the third switch IC 260 are connected respectively to output terminals 251*a*, 251*b*, 251*c* and 251*d* on the output side of the low-noise amplifiers 250*a*, 250*b*, 250*c* and 250*d*. The common terminal 260*e* is connected to the output terminal 6.

With the above-described configuration, the front-end module 200 inputs the high frequency signal having passed through the filter 21*a*, 21*b*, 21*c* or 21*d* to any one of the low-noise amplifiers 250*a*, 250*b*, 250*c* and 250*d* through the second switch IC 230. Moreover, the front-end module 200 can vary the impedance of the matching circuit 240 by controlling the switches 242, 244, 246 and 248 and changing combination of the inductors 241, 243, 245 and 247. It is hence possible to perform the impedance matching suitable for the low-noise amplifier 250*a*, 250*b*, 250*c* or 250*d* in use.

The front-end module 200 may be a front-end module constituting only a reception demultiplexer circuit or a front-end module constituting only a transmission multiplexer circuit. Alternatively, the front-end module 200 may be a demultiplexer/multiplexer circuit capable of performing both transmission and reception. The number of frequency bands (signal paths) capable of being handled by the front-end module 200 is not limited to four in the above-described case.

Furthermore, the front-end module 1 may be designed in configuration including the first switch IC 11 or not including the first switch IC 11. Similarly, the front-end module 1 may be designed in configuration including the third switch IC 260 or not including the third switch IC 260.

[4-2. Operation of Front-End Module]

Operation of the front-end module 200 will be described below. Operations of the first switch IC 11 and the filters 21a, 21b, 21c and 21d are similar to the operations of the first switch IC 11 and the filters 21a, 21b, 21c and 21d described in Embodiment 2, and hence the description of those operations is omitted.

When the high frequency signal in the frequency band of the filter 21a is received at the antenna terminal 5, the switches 242, 246 and 248 are turned to the off-state and the switch 244 is turned to the on-state, by way of example, in the matching circuit 240. Furthermore, the low-noise amplifier 250a is turned to the on-state, and the low-noise amplifiers 250b, 250c and 250d are turned to the off-state. In the third switch IC 260, the common terminal 260e is connected to the selection terminal 260a.

In this case, the output terminals 251a and 251b are respectively the second terminal and the third terminal. One of the output terminals 251c and 251d is a fourth terminal. A path between the input terminal 240a of the matching circuit 240 and the output terminal 251a connected to the output side of the low-noise amplifier 250a is the first path. A path between the input terminal 240b of the matching circuit 240 and the output terminal 251b connected to the output side of the low-noise amplifier 250b is the second path. A path between the input terminal 240c of the matching circuit 240 and the output terminal 251c connected to the output side of the low-noise amplifier 250c is a third path through which a signal in a third frequency band different from the first frequency band and the second frequency band is transferred. Alternatively, a path between the input terminal 240d of the matching circuit 240 and the output terminal 251d connected to the output side of the low-noise amplifier 250d is the third path through which the signal in the third frequency band is transferred. Moreover, the low-noise amplifier 250a is the first amplifier and the low-noise amplifier 250b is the second amplifier. One of the low-noise amplifiers 250c and 250d is a third amplifier arranged in the third path. The inductors 241 and 243 are respectively the first matching element and the second matching element. One of the inductors 245 and 247 is a fourth matching element arranged in the third path. The switches 242 and 244 are respectively the first switch and the second switch. One of the switches 246 and 248 is a fourth switch connected between the reference terminal and a part of the third path, the part spanning between the fourth matching element and the third amplifier.

In other words, the inductor 241 and the low-noise amplifier 250a are connected in series between the input terminal 240a and the output terminal 251a. Furthermore, the inductor 243 is connected between the reference terminal and a path between the input terminal 240a and the inductor 241. With such an arrangement, the matching circuit 240 can perform the impedance matching on the input side of the low-noise amplifier 250a with the inductor 241 and the inductor 243.

Any one of the switches 244, 246 and 248 may be turned to the on-state without being limited to the switch 244. The impedance of the matching circuit 240 can be varied by changing the switch that is turned to the on-state. The number of switches to be turned to the on-state among the switches 244, 246 and 248 is not limited to one and may be plural.

As in the above-described case, also when the high frequency signal in any one of the frequency bands of the filters 21b, 21c and 21d is received at the antenna terminal 5, one of the switches 244, 246 and 248 is turned to the off-state, the one switch being connected to the first path to which one of the filters 21b, 21c and 21d allowing the received high frequency signal to pass therethrough is connected, while at least one of the remaining switches is turned to the on-state. Stated in another way, when the signal is transferred through any one of the first path, the second path, and the third path, one of the first switch, the second switch, and the fourth switch, the one switch being arranged between the reference terminal and the one path through which the signal is transferred, is turned to the off-state. On the other hand, at least one of the first switch, the second switch, and the fourth switch, the one switch being arranged between the reference terminal and the path other than the one path through which the signal is transferred, is turned to the on-state. Accordingly, the impedance of the matching circuit 240 can be varied and the impedance matching suitable for the low-noise amplifier 250b, 250c or 250d in use can be performed.

Thus, in the front-end module 200, the four low-noise amplifiers 250a, 250b, 250c and 250d are used with respect to the four filters 21a, 21b, 21c and 21d, and the four inductors 241, 243, 245 and 247 and the four switches 242, 244, 246 and 248 are used in the matching circuit 240. By selectively turning the switches 242, 244, 246 and 248 to the on-state or the off-state, the impedance matching is performed with use of at least two among the inductors 241, 243, 245 and 247 when any one of the low-noise amplifiers 250a, 250b, 250c and 250d is used. In the front-end module 200, therefore, the number of inductors and switches used in the matching circuit 240 can be reduced in comparison with that required in the related art. Moreover, because the second switch IC 230 includes the plurality of common terminals and the plurality of selection terminals and the paths between the input terminals 240a, 240b, 240c, 240d and the inductors 241, 243, 245, 247 are interconnected by the wirings 249a, 249b and 249c in the matching circuit 240, the impedance of the matching circuit 240 can be varied by changing combination of the multiple inductors. As a result, the impedance matching suitable for the low-noise amplifier 250a, 250b, 250c or 250d in use can be performed.

[4-3. Advantageous Effects and Others]

As described above, with the front-end module 200 according to this embodiment, the number of inductors and switches used in the matching circuit 240 of the front-end module 200 can be reduced in comparison with that required in the related art. In addition, the impedance matching suitable for the low-noise amplifier 250a, 250b, 250c or 250d in use can be performed by optionally changing combination of the multiple inductors and varying the impedance of the matching circuit 240.

Embodiment 5

Figure 8A:
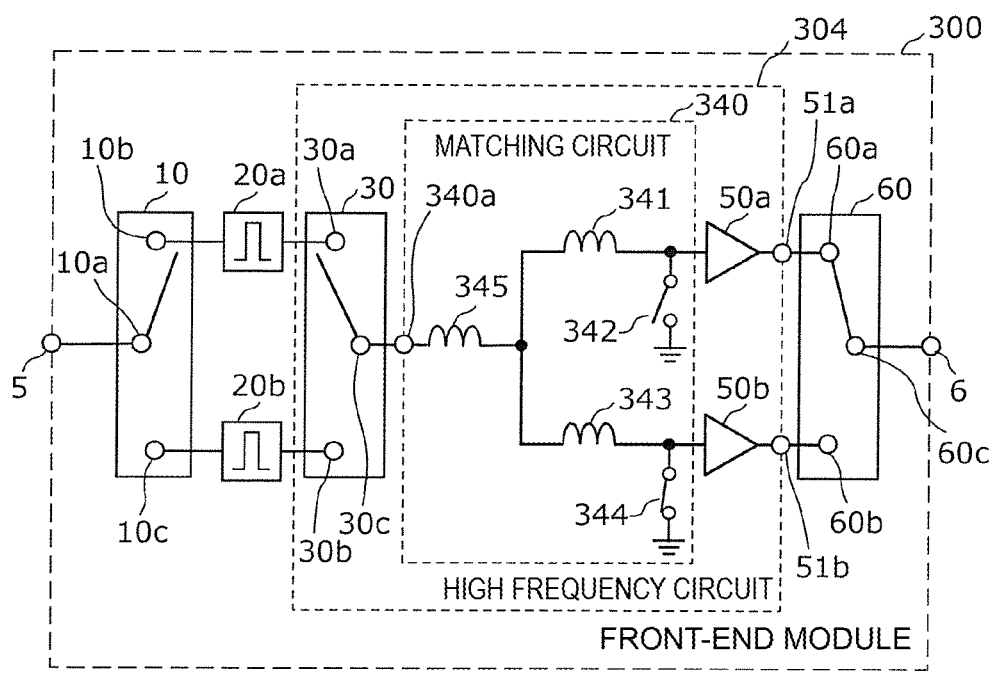
FIG. 8A illustrates an operating state of a front-end module using a high frequency circuit according to Embodiment 5.
Figure 8B:
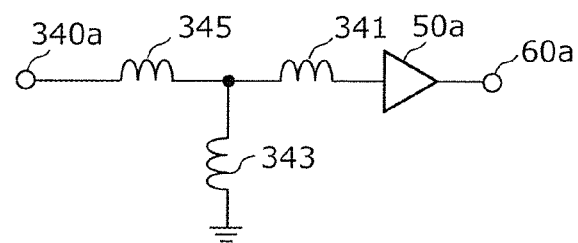
FIG. 8B is an equivalent circuit diagram of the high frequency circuit illustrated in FIG. 8A.

A front-end module 300 using a high frequency circuit 304 according to Embodiment 5 will be described below. FIG. 8A illustrates an operating state of the front-end module 300 using the high frequency circuit 304 according to this embodiment. FIG. 8B is an equivalent circuit diagram of the high frequency circuit 304 illustrated in FIG. 8A.

The front-end module 300 according to this embodiment is different from the front-end module 1 according to Embodiment 1 in that a matching circuit includes an additional inductor.

[5-1. Configuration of Front-End Module]

As illustrated in FIG. 8A, the front-end module 300 is a front-end circuit including an antenna terminal 5, an output terminal 6, a first switch IC 10, filters 20a and 20b, a second switch IC 30, a matching circuit 340, low-noise amplifiers 50a and 50b, and a third switch IC 60. The high frequency circuit 304 is constituted by the matching circuit 340 and the low-noise amplifiers 50a and 50b. The first switch IC 10, the filters 20a and 20b, the second switch IC 30, the low-noise amplifiers 50a and 50b, and the third switch IC 60 have the same configurations as those of the first switch IC 10, the filters 20a and 20b, the second switch IC 30, the low-noise amplifiers 50a and 50b, and the third switch IC 60 described in Embodiment 1, and hence the detailed description of those components is omitted.

The matching circuit 340 includes inductors 341, 343 and 345 and switches 342 and 344. In this embodiment, an input terminal 340a is the first terminal. The input terminal 340a may be arranged outside the second switch IC 30. In another example, a common terminal 30c of the second switch IC 30 may be used as the input terminal 340a. In that case, the common terminal 30c is the first terminal.

One end of each of the inductors 341 and 343 is connected in common to the inductor 345. The inductor 345 is connected between the input terminal 40a and a common junction point between the inductors 341 and 343. The inductor 345 is a third matching element. The other end of the inductor 341 is connected to an input end of the low-noise amplifier 50a. The switch 342 is connected between the reference terminal (ground) and a path between the inductor 341 and the low-noise amplifier 50a. The other end of the inductor 343 is connected to an input end of the low-noise amplifier 50b. The switch 344 is connected between the reference terminal and a path between the inductor 343 and the low-noise amplifier 50b.

The other configuration of the matching circuit 340 is similar to that of the matching circuit 40 described in Embodiment 1, and hence the description of the other configuration is omitted.

With the above-described configuration, the front-end module 300 can perform the impedance matching suitable for the low-noise amplifier 50a or 50b in use by controlling the switches 342 and 344.

The front-end module 300 may be a front-end module constituting only a reception demultiplexer circuit or a front-end module constituting only a transmission multiplexer circuit. Alternatively, the front-end module 300 may be a demultiplexer/multiplexer circuit capable of performing both transmission and reception. The number of frequency bands (signal paths) capable of being handled by the front-end module 300 is not limited.

[5-2. Operation of Front-End Module]

Operation of the front-end module 300 will be described below.

FIG. 8B illustrates an equivalent circuit of the path between the input terminal 340a of the matching circuit 340 and the output terminal 51a connected to the output side of the low-noise amplifier 50a when the filter 20a and the low-noise amplifier 50a are used. Operations of the first switch IC 10, the filters 20a and 20b, and the second switch IC 30 are similar to the operations of the first switch IC 10, the filters 20a and 20b, and the second switch IC 30 described in Embodiment 1, and hence the description of those operations is omitted.

When the high frequency signal in the frequency band of the filter 20a is received at the antenna terminal 5, the switch 342 is turned to the off-state and the switch 344 is turned to the on-state in the matching circuit 340. Moreover, the low-noise amplifier 50a is turned to the on-state, and the low-noise amplifier 50b is turned to the off-state. The path between the input terminal 340a of the matching circuit 340 and the output terminal 51a connected to the output side of the low-noise amplifier 50a in this case is the first path.

In the equivalent circuit representing the first path, as illustrated in FIG. 8B, the inductor 341 and the low-noise amplifier 50a are connected in series between the input terminal 340a and the output terminal 51a. Furthermore, the inductor 343 is connected between the reference terminal and a path between the input terminal 340a and the inductor 341. With such an arrangement, the matching circuit 340 can perform the impedance matching on the input side of the low-noise amplifier 50a by using the inductor 345 in addition to the inductor 341 and the inductor 343.

When the high frequency signal in the frequency band of the filter 20b is received at the antenna terminal 5, the switch 342 is turned to the on-state and the switch 344 is turned to the off-state in the matching circuit 340. Moreover, the low-noise amplifier 50a is turned to the off-state, and the low-noise amplifier 50b is turned to the on-state. A path between the input terminal 340a of the matching circuit 340 and an output terminal 51b connected to the output side of the low-noise amplifier 50b in this case is the second path. With such an arrangement, the matching circuit 340 can perform the impedance matching on the input side of the low-noise amplifier 50b by using the inductor 345 in addition to the inductor 341 and the inductor 343. Hence the matching circuit 340 can perform the impedance matching more suitable for the low-noise amplifier 50a or 50b.

[5-3. Advantageous Effects and Others]

As described above, with the front-end module 300 according to this embodiment, even when the number of filters is increased, there is no necessity of increasing the numbers of inductors, switches, and low-noise amplifiers used in the matching circuit 340 depending on the number of filters. In the front-end module 300, therefore, the impedance matching more suitable for the low-noise amplifier 50a or 50b can be performed by using the inductor 345 in addition to the inductor 341 and the inductor 343.

Other Embodiments and so on

While the high frequency circuits according to the practical examples of the present disclosure and the front-end circuits (front-end modules) using the high frequency circuits have been described above in connection with the embodiments, the high frequency circuits and the front-end modules according to the present disclosure are not limited the above-described embodiments. Other embodiments realized by combining optional constituent elements in the above-described embodiments, modifications obtained by variously modifying the above-described embodiments in accordance with ideas conceived by those skilled in the art within the scope not departing from the gist of the present disclosure, and various devices incorporating the above-described high frequency circuits also fall within the scope of the present disclosure.

Figure 9:
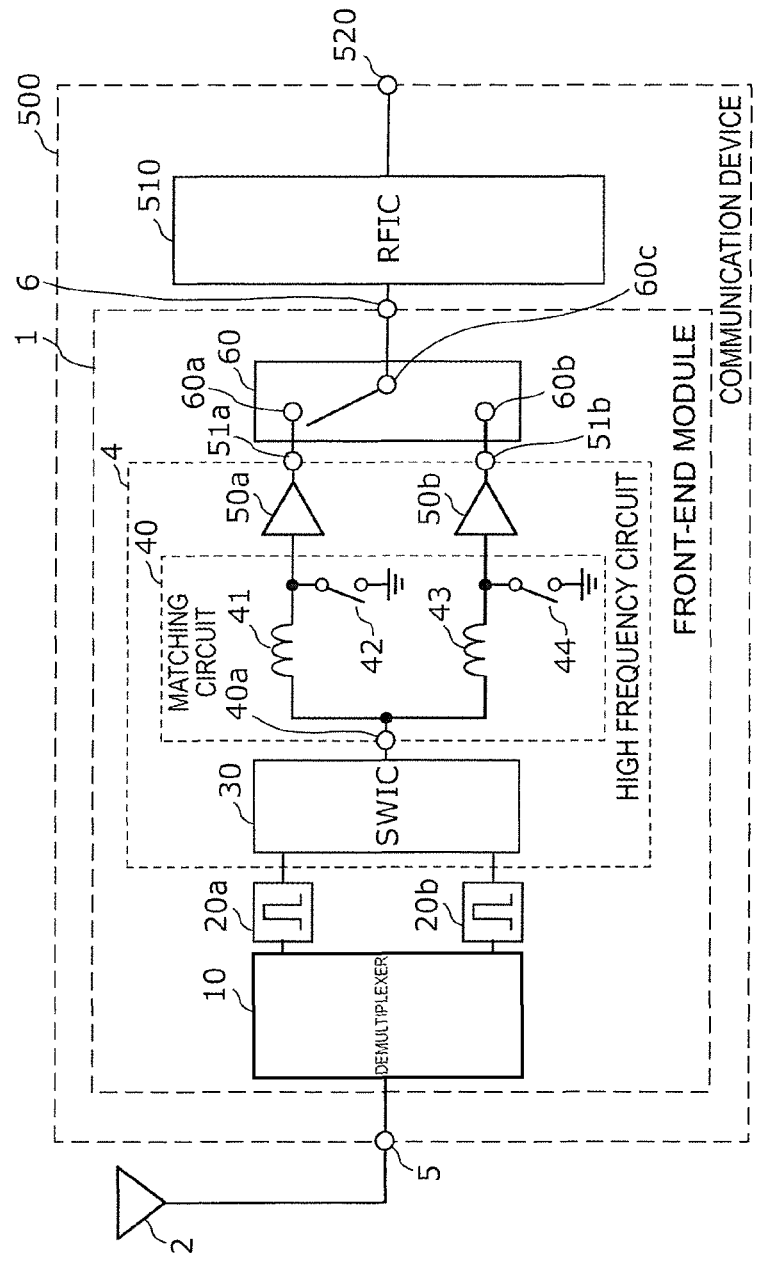
FIG. 9 is a circuit diagram of a communication device using any of the high frequency circuits according to Embodiments 1 to 5.

For example, the high frequency circuits and the front-end modules described in Embodiments 1 to 5 may be each incorporated in a communication device. FIG. 9 is a schematic plan view illustrating a circuit layout of the communication device according to Embodiments 1 to 5.

As illustrated in FIG. 9, the communication device 500 includes the front-end module 1 and an RF signal processing circuit (RFIC) 510. The communication device 500 is connected to the antenna element 2. The RFIC 510 executes signal processing, such as down conversion, on a high frequency reception signal that is inputted from the antenna element 2 through the front-end module 1. The high frequency reception signal produced with the signal processing is outputted from an output terminal 520 to a next-stage circuit such as a base band signal processing circuit (BBIC), for example. The communication device 500 may include the BBIC in itself. A multiplexer may be arranged instead of a switch IC 10, illustrated in FIG. 9, which serves as a demultiplexer.

In the high frequency circuits, the front-end modules, and the communication device according to the above-described embodiments, other high frequency circuit elements, wirings, or the likes may be inserted between the paths interconnecting the circuit elements and the signal paths that are disclosed in the drawings.

The switches and the switch ICs may be each constituted using CMOS. In this case, the switches and the switch ICs can be manufactured at a lower cost.

The switches and the switch ICs may be each constituted using GaAs. In this case, a digital control signal with high quality can be produced, and a high frequency signal with high-quality amplification performance and noise performance can be outputted.

The switches and the switch ICs may be each realized with LSI (Large Scale Integration), i.e., an integrated circuit. The integrated circuit may be realized with a dedicated circuit or a universal processor. It is also possible to utilize FPGA (Field Programmable Gate Array) that is programmable after manufacturing of LSI, or a reconfigurable processor that can reconfigure the connections and settings of circuit cells within LSI after the manufacturing. If new techniques for manufacturing the integrated circuit will be developed instead of LSI with the progress of semiconductor techniques and other derivative techniques, functional blocks may be of course integrated by using the new techniques.

The present disclosure can be implemented as a front-end module disposed in a multiband/multimode adaptable front-end section, and can be widely utilized in communication devices such as a cellular phone.

1, 100, 100a, 101, 200, 300 front-end module
2 antenna element
4, 4a, 104, 204, 304 high frequency circuit
5 antenna terminal
6 output terminal
10, 11 first switch IC (demultiplexer)
10a, 11a common terminal
10b, 10c, 11b, 11c, 11d, 11e selection terminal
20a, 20b, 21a, 21b, 21c, 21d filter
30, 30d, 31, 131, 132 second switch IC (third switch)
30a, 30b, 31a, 31b, 31c, 31d, 131a, 131b, 132a, 132b, 231a, 231b, 231c, 231d selection terminal
30c, 30e, 30f, 131c, 132c, 232a, 232b, 232c, 232d common terminal
30g, 30h terminal
40, 45a, 45b, 140, 240, 340 matching circuit
40a, 140a, 140b, 240a, 240b, 240c, 240d, 340a input terminal (first terminal)
41, 341 inductor (first matching element)
42, 342 switch (first switch)
43, 343 inductor (second matching element)
44, 344 switch (second switch)
46, 47 inductor
50a low-noise amplifier (first amplifier)
50b low-noise amplifier (second amplifier)
51a, 251a output terminal (second terminal)
51b, 251b output terminal (third terminal)
60, 260 third switch IC
60a, 60b, 260a, 260b, 260c, 260d selection terminal
60c, 260e common terminal
130 switch unit
141 wiring
241, 243, 245, 247 inductor (first matching element, second matching element)
242, 244, 246, 248 switch (first switch, second switch)
250a, 250b, 250c, 250d low-noise amplifier (first amplifier, second amplifier)
345 inductor (third matching element)
500 communication device
510 RF signal processing circuit

The invention claimed is:

1. A high frequency circuit comprising:
a first terminal, a second terminal, and a third terminal;
a first path connected between the first terminal and the second terminal and transferring a signal in a first frequency band;
a second path connected between the first terminal and the third terminal and transferring the signal in a second frequency band that is different from the first frequency band;
a first matching element and a first amplifier both arranged in the first path;
a first switch connected between a reference terminal and a part of the first path, the part of the first path spanning between the first matching element and the first amplifier;
a second matching element and a second amplifier both arranged in the second path; and
a second switch connected between the reference terminal and a part of the second path, the part of the second path spanning between the second matching element and the second amplifier,
wherein the first switch is turned to an off-state and the second switch is turned to an on-state when the signal is transferred to the first path, and
the first switch is turned to an on-state and the second switch is turned to an off-state when the signal is transferred to the second path.

2. The high frequency circuit according to claim 1, further comprising a third switch having at least one common terminal,
wherein the at least one common terminal is connected to the first terminal.

3. The high frequency circuit according to claim 2, wherein the at least one common terminal comprises one common terminal, and
the at least one common terminal is the first terminal.

4. The high frequency circuit according to claim 3, further comprising a third matching element that is connected between a common junction point between the first matching element and the second matching element and the at least one common terminal.

5. A communication device comprising:
a front-end circuit comprising:
a demultiplexer;
a plurality of filters; and
the high frequency circuit according to claim 3; and
an RF signal processing circuit.

6. The high frequency circuit according to claim 2, wherein the at least one common terminal comprises a plurality of common terminals, and the plurality of common terminals are electrically connected to each other.

7. The high frequency circuit according claim 2, further comprising:
a fourth terminal;
a third path connected between the first terminal and the fourth terminal and transferring the signal in a third frequency band that is different from the first frequency band and the second frequency band;
a fourth matching element and a third amplifier both arranged in the third path; and
a fourth switch connected between the reference terminal and a part of the third path, the part of the third path spanning between the fourth matching element and the third amplifier,
wherein, when the signal is transferred to any one of the first path, the second path, and the third path, one of the first switch, the second switch, or the fourth switch arranged between the reference terminal and the any one path through which the signal is transferred, is turned to an off-state and at least one of the first switch, the second switch, or the fourth switch arranged between the reference terminal and a path other than the any one path through which the signal is transferred, is turned to an on-state.

8. A front-end circuit comprising:
a demultiplexer;
a plurality of filters; and
the high frequency circuit according to claim 2.

9. The front-end circuit according to claim 8,
wherein each of the plurality of filters is a receive filter configured to filter the signal in one of the first frequency band or the second frequency band.

10. A communication device comprising:
a front-end circuit comprising:
  a demultiplexer;
  a plurality of filters; and
  the high frequency circuit according to claim 2; and
an RF signal processing circuit.

11. The communication device according to claim 10,
wherein each of the plurality of filters is a receive filter configured to filter the signal in one of the first frequency band or the second frequency band.

12. The high frequency circuit according claim 1, further comprising:
a fourth terminal;
a third path connected between the first terminal and the fourth terminal and transferring the signal in a third frequency band that is different from the first frequency band and the second frequency band;
a fourth matching element and a third amplifier both arranged in the third path; and
a fourth switch connected between the reference terminal and a part of the third path, the part of the third path spanning between the fourth matching element and the third amplifier,
wherein, when the signal is transferred to any one of the first path, the second path, and the third path, one of the first switch, the second switch, or the fourth switch arranged between the reference terminal and the any one path through which the signal is transferred, is turned to an off-state and at least one of the first switch, the second switch, or the fourth switch arranged between the reference terminal and a path other than the any one path through which the signal is transferred, is turned to an on-state.

13. A front-end circuit comprising:
a demultiplexer;
a plurality of filters; and
the high frequency circuit according to claim 12.

14. The front-end circuit according to claim 13,
wherein each of the plurality of filters is a receive filter configured to filter the signal in one of the first frequency band, the second frequency band, or the third frequency band.

15. A communication device comprising:
a front-end circuit comprising:
  a demultiplexer;
  a plurality of filters; and
  the high frequency circuit according to claim 12; and
an RF signal processing circuit.

16. The communication device according to claim 15,
wherein each of the plurality of filters is a receive filter configured to filter the signal in one of the first frequency band, the second frequency band, or the third frequency band.

17. A front-end circuit comprising:
a demultiplexer;
a plurality of filters; and
the high frequency circuit according to claim 1.

18. The front-end circuit according to claim 17,
wherein each of the plurality of filters is a receive filter configured to filter the signal in one of the first frequency band or the second frequency band.

19. A communication device comprising:
a front-end circuit comprising:
  a demultiplexer;
  a plurality of filters; and
  the high frequency circuit according to claim 1; and
an RF signal processing circuit.

20. The communication device according to claim 19,
wherein each of the plurality of filters is a receive filter configured to filter the signal in one of the first frequency band or the second frequency band.

* * * * *